(12) United States Patent
Huang et al.

(10) Patent No.: US 7,248,084 B2
(45) Date of Patent: Jul. 24, 2007

(54) METHOD FOR DETERMINING SWITCHING STATE OF A TRANSISTOR-BASED SWITCHING DEVICE

(75) Inventors: Chun-Yen Huang, Chu-Pei (TW); Hung-Der Su, Kaohsiung Hsien (TW); Jing-Meng Liu, Hsin-Chu (TW); Chung-Lung Pai, Hsin-Chu (TW); Shih-Hui Chen, Kaohsiung (TW); Yang-Ping Hung, Yun-Lin Hsien (TW)

(73) Assignee: Richtek Technology Corp., Chupei (TW)

( * ) Notice: Subject to any disclaimer, the term of this patent is extended or adjusted under 35 U.S.C. 154(b) by 89 days.

(21) Appl. No.: 11/108,742

(22) Filed: Apr. 19, 2005

(65) Prior Publication Data

US 2006/0109046 A1 May 25, 2006

(30) Foreign Application Priority Data

Nov. 17, 2004 (TW) .............................. 93135229 A

(51) Int. Cl.
*H03K 3/00* (2006.01)
(52) U.S. Cl. .................. 327/108; 327/112; 326/82; 326/83
(58) Field of Classification Search ................ None
See application file for complete search history.

(56) References Cited

U.S. PATENT DOCUMENTS

| 4,785,203 | A | * | 11/1988 | Nakamura | 326/87 |
| 5,483,188 | A | * | 1/1996 | Frodsham | 327/170 |
| 5,825,219 | A | * | 10/1998 | Tsai | 327/112 |
| 6,720,803 | B2 | * | 4/2004 | Pihlstrom | 327/108 |
| 6,873,196 | B2 | * | 3/2005 | Humphrey | 327/170 |

* cited by examiner

*Primary Examiner*—Tuan Lam
(74) *Attorney, Agent, or Firm*—Finnegan, Henderson, Farabow, Garrett & Dunner, L.L.P.

(57) ABSTRACT

A method, which is for determining switching state of a transistor-based switching device that includes a set of transistors, includes the steps of: applying a bias voltage to a transistor having a fastest response so as to dispose the transistors in the set in a desired transistor state; detecting a voltage level at a transistor having a slowest response to the bias voltage; and comparing the detected voltage level with a predetermined threshold voltage level in order to determine the switching state of the switching device. A transistor-based switching device is also disclosed.

7 Claims, 4 Drawing Sheets

METHOD FOR DETERMINING SWITCHING STATE OF A TRANSISTOR-BASED SWITCHING DEVICE

CROSS-REFERENCE TO RELATED APPLICATION

This application claims priority of Taiwanese application no. 093135229, filed on Nov. 17, 2004.

BACKGROUND OF THE INVENTION

1. Field of the Invention

The invention relates to a method for determining switching state of a transistor-based switching device, more particularly to a method for determining effectively the switching state of a transistor-based switching device.

2. Description of the Related Art

FIG. 1 illustrates a simplified transistor-based switching device 1 that includes first and second sets of field-effect transistors 9, 10, a controller circuit 11 (e.g., a PWM or a PFM controller in a switching power supply), first and second logic circuits 12, 13, and first and second driving circuits 14, 15.

The field-effect transistors in each of the first and second sets 9, 10 are connected in parallel.

The first driving circuit 14 has input and output nodes connected electrically and respectively to the first logic circuit 12 and the gates of the field-effect transistors in the first set 9, whereas the second driving circuit 15 has input and output nodes connected electrically and respectively to the second logic circuit and the gates of the field-effect transistors in the second set 10.

The first and second logic circuits 12, 13 are connected electrically to the controller circuit 11. The first logic circuit 12 is further connected electrically across gate and source of the field-effect transistor in the second set 10 closest to the output node of the second driving circuit 15. The second logic circuit 13 is further connected electrically a cross gate and source of the field-effect transistor in the first set 9 closest to the output node of the first driving circuit 14.

In operation, the first driving circuit 14 applies a voltage to the gates of the field-effect transistors in the first set 9 so as to dispose the transistors in the first set 9 in a non-conducting state. The second logic circuit 13 then detects a voltage level across the gates and sources of the field-effect transistors in the first set 9, and compares the detected voltage level with a predetermined threshold voltage level. When the detected voltage level is found to be lower than the predetermined threshold voltage level, the second driving circuit 15 applies a voltage to the gates of the field-effect transistors in the second set 10 so as to dispose the transistors in the second set 10 in a conducting state. After a predetermined period, the second driving circuit 15 applies the voltage to the gates of the field-effect transistors in the second set 10 so as to dispose the field-effect transistors in the second set 10 in a non-conducting state. The first logic circuit 12 then detects a voltage level across the gates and sources of the field-effect transistors in the second set 10, and compares the detected voltage level with the predetermined threshold voltage level. When the detected voltage level is found to be lower than the predetermined threshold voltage level, the first driving circuit 14 applies the voltage to the gates of the field-effect transistors in the first set 9 so as to dispose the field-effect transistors in the first set 9 in a conducting state. After the predetermined period, the whole operation is repeated.

The problem with the simplified transistor-based switching device 1 is that, since the gates of the field-effect transistors are disposed at different distances from the output node of the corresponding driving circuit 14, 15, the field-effect transistors in each of the first and second sets 9, 10 have different actual response times to the bias voltage. Since the voltage level is detected across the gate and source of the transistor in the first (second) set 9 (10) closest to the output node of the second (first) driving circuit 15 (14), the detected voltage level is not an accurate indication of the transistor state of all the field-effect transistors in each of the first (second) set 9 (10).

In order to solve the above problem, with further reference to FIG. 2, a conventional transistor-based switching device 1' further includes first and second delay circuits 16, 17, and first and second detecting circuits 18, 19.

Each of the first and second delay circuits 16, 17 is connected electrically to a respective one of the first and second logic circuits 12, 13.

The first detecting circuit 18 is connected electrically to the first delay circuit 16 and across the gate and source of the field-effect transistor in the second set 10 closest to the output node of the second driving circuit 15, whereas the second detecting circuit 19 is connected electrically to the second delay circuit 17 and across the gate and source of the field-effect transistor in the first set 9 closest to the output node of the first driving circuit 14.

In operation, the first driving circuit 14 applies a voltage to the gates of the field-effect transistors in the first set 9 so as to dispose the field-effect transistors in the first set 9 in a non-conducting state. The second detecting circuit 19 then detects a voltage level across the gates and sources of the field-effect transistors in the first set 9, and compares the detected voltage level with the predetermined threshold voltage level. The second delay circuit 17 introduces a delay into the detected voltage level. The delay introduced by the second delay circuit 17 ensures that the field-effect transistors in the first set 9 are all in the non-conductive state. Thereafter, the second logic circuit 13 enables the second driving circuit 15 to apply a voltage to the gates of the field-effect transistors in the second set 10 so as to dispose the field-effect transistors in the second set 10 in a conducting state. After the predetermined period, the second driving circuit 15 applies a voltage to the gates of the field-effect transistors in the second set 10 so as to dispose the field-effect transistors in the second set 10 in a non-conducting state. The first detecting circuit 18 then detects a voltage level across the gates and sources of the field-effect transistors in the second set 10, and compares the detected voltage level with the predetermined threshold voltage level. The first delay circuit 16 introduces a delay into the detected voltage level. Then, the first driving circuit 14 is enabled by the first logic circuit 12 to apply a voltage to the gates of the field-effect transistors in the first set 9 so as to dispose the field-effect transistors in the first set 9 in a conducting state. After the predetermined period, the whole operation is repeated.

Although the aforesaid conventional transistor-based switching device 1' achieves its intended purpose, it requires the first and second delay circuit 16, 17 and the first and second detecting circuits 18, 19. This results in a larger size for the conventional transistor-based switching device 1' and in higher fabrication costs. Furthermore, the predetermined delay time periods introduced by the first and second delay circuits 16, 17, when not accurate, the field-effect transistors in the first and second sets 9, 10 may conduct simultaneously, which results in a poor operating efficiency for the conventional transistor-based switching device 1'.

SUMMARY OF THE INVENTION

Therefore, the object of the present invention is to provide a method for determining switching state of a transistor-based switching device that is capable of overcoming the aforementioned drawbacks of the prior art.

According to one aspect of the present invention, a method for determining switching state is implemented using a transistor-based switching device that includes a set of transistors. The transistors in the set are connected in parallel in such a manner that one of the transistors has a fastest response to a bias voltage in relation to the other transistors in the set, and that another of the transistors has a slowest response to the bias voltage in relation to the other transistors in the set. The method comprises the steps of:

A) applying the bias voltage to a gate of the transistor having the fastest response so as to dispose the transistors in the set in a desired transistor state;

B) detecting a voltage level across gate and source of the transistor having the slowest response to the bias voltage; and C) comparing the voltage level detected in step B) with a predetermined threshold voltage level in order to determine the switching state of the switching device.

According to another aspect of the present invention, a method for determining switching state is implemented using a transistor-based switching device that includes first and second sets of transistors. The transistors in each of the first and second sets are connected in parallel in such a manner that one of the transistors in each of the first and second sets has a fastest response to a bias voltage in relation to the other transistors in the same one of the first and second sets, and that another of the transistors in each of the first and second sets has a slowest response to the bias voltage in relation to the other transistors in the same one of the first and second sets. The method comprises the steps of:

A) applying a bias voltage to a gate of the transistor in the first set that has the fastest response so as to dispose the transistors in the first set in a first transistor state;

B) detecting a voltage level across gate and source of the transistor in the first set that has the slowest response; and C) comparing the voltage level detected in step B) with a predetermined threshold voltage level.

According to yet another aspect of the present invention, a transistor-based switching device comprises a set of transistors connected in parallel. Each of the transistors has a gate. The gate of one of the transistors has a fastest response to a bias voltage in relation to the other transistors in the set being provided with a drive end. The gate of another one of said transistors that has a slowest response to the bias voltage in relation to the other transistors in the set being provided with a detected end. The drive end is adapted to be applied with a bias voltage so as to dispose the transistors in the set in a desired transistor state. A voltage at the said detected end is detected for comparison with a predetermined threshold voltage level in order to determine switching state of the switching device.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENT

Figure 1:
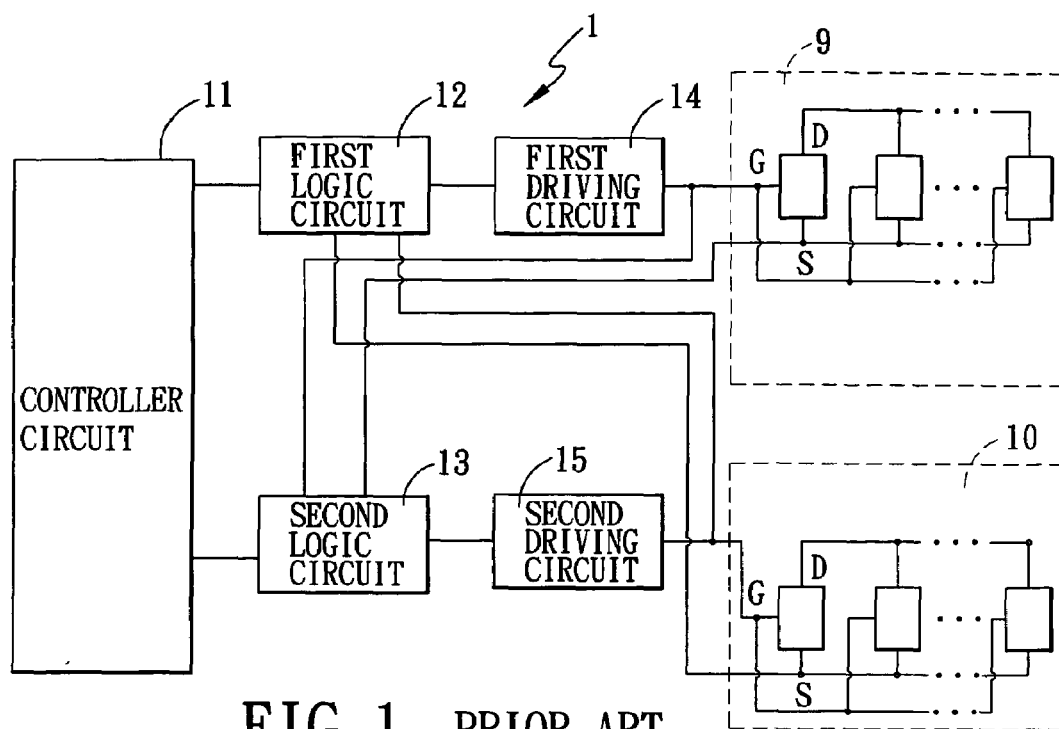
FIG. 1 is a schematic block diagram of a simplified transistor-based switching device.
Figure 2:
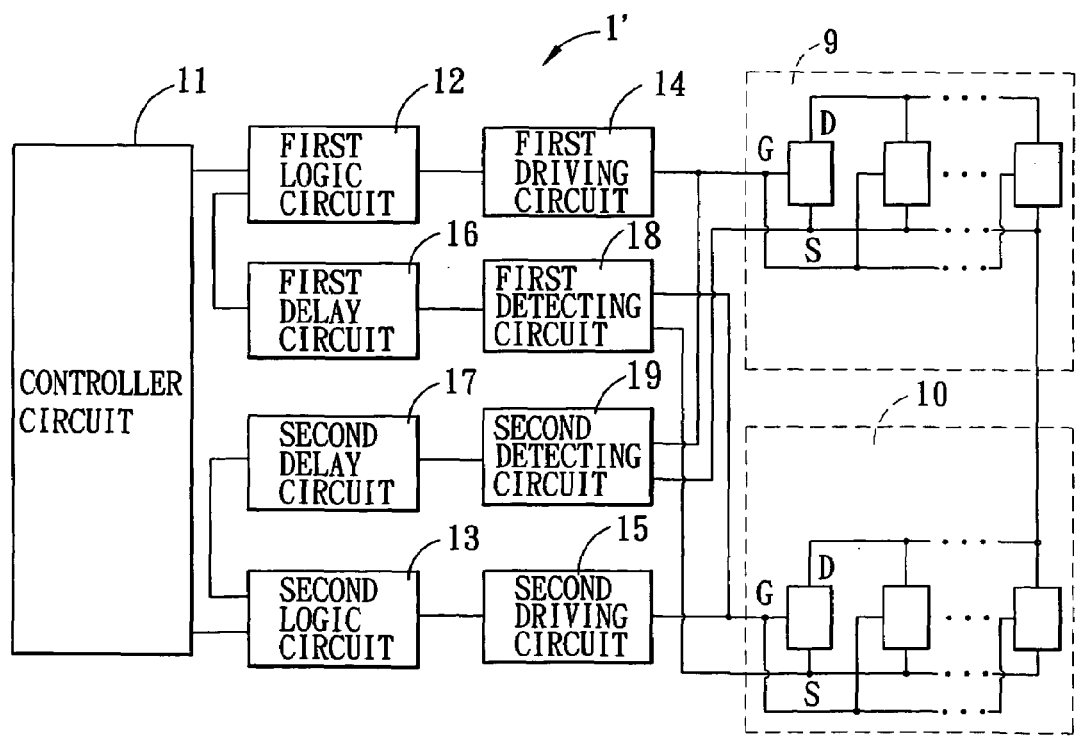
FIG. 2 is a schematic block diagram of a conventional transistor-based switching device.
Figure 3:
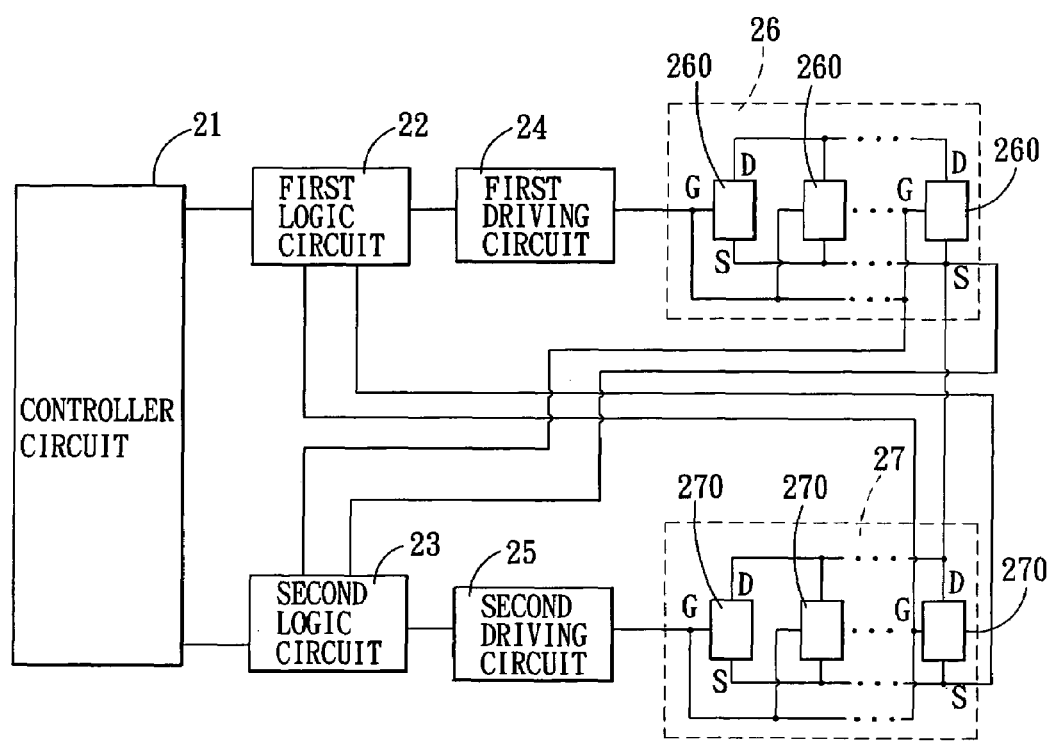
FIG. 3 is a schematic block diagram of the preferred embodiment of a transistor-based switching device according to the present invention.

Referring to FIG. 3, the preferred embodiment of a transistor-base switching device according to this invention is shown to include first and second sets of transistors 26, 27.

In this embodiment, each of the transistors 260, 270 in each of the first and second sets 26, 27 may be one of an n-type metal-oxide-semiconductor field-effect transistor (MOSFET), an n-type metal-insulator-semiconductor field-effect transistor (MISFET), and an n-type junction field-effect transistor (JFET). In an alternative embodiment, each of the transistors 260, 270 in each of the first and second sets 26, 27 may be one of a p-type MOSFET, a p-type MISFET, and a p-type JFET.

The transistors 260 in the first set 26 are connected in parallel in such a manner that one of the transistors 260 in the first set 26 has a fastest response to a bias voltage in relation to the other transistors 260 in the same first set 26, and that another of the transistors 260 in the first set 26 has a slowest response to the bias voltage in relation to the other transistors 260 in the same first set 26. In particular, the source (S) of each of the transistors 260 in the first set 26 is connected to those of the other ones of the transistors 260 in the first set 26. The drain (D) of each of the transistors 260 in the first set 26 is connected to those of the other ones of the transistors 260 in the first set 26. The gate (G) of each of the transistors 260 in the first set 26 is connected to those of the other ones of the transistors 260 in the first set 26.

Similarly, the transistors 270 in the second set 27 are connected in parallel in such a manner that one of the transistors 270 in the second set 27 has a fastest response to a bias voltage in relation to the other transistors 270 in the same second set 27, and that another of the transistors 270 in the second set 27 has a slowest response to the bias voltage in relation to the other transistors 270 in the same second set 27. In particular, the source (S) of each of the transistors 270 in the second set 27 is connected to those of the other ones of the transistors 270 in the second set 27. The drain (D) of each of the transistors 270 in the second set 27 is connected to those of the other ones of the transistors 270 in the second set 27. The gate (G) of each of the transistors 270 in the second set 27 is connected to those of the other ones of the transistors 270 in the second set 27.

The transistor-base switching device further includes a controller circuit 21, first and second logic circuits 22, 23, and first and second driving circuits 24, 25.

In this embodiment, the controller circuit 21 may be one of a pulse width modulator (PWM) or a pulse frequency modulator (PFM) controller commonly found in switching power supply applications.

The first logic circuit 22 is connected electrically to and is controlled by the controller circuit 21, and is connected electrically across the gate (G) and source (S) of the transistor 270 in the second set 27 that has the slowest response. On the other hand, the second logic circuit 23 is connected electrically to and is controlled by the controller circuit 21, and is connected electrically across the gate (G) and the source (S) of the transistor 260 in the first set 26 that has the slowest response.

The first driving circuit 24 is connected electrically to the first logic circuit 22, and the gate (G) of the transistor 260 in the first set 26 that has the fastest response. On the other hand, the second driving circuit 25 is connected electrically to the second logic circuit 23, and the gate (G) of the transistor 270 in the second set 27 that has the fastest response.

It is noted that the transistor 260 in the first set 26 that has the fastest response is at a location closest to an output node of the first driving circuit 24, and the transistor 260 in the first set 26 that has the slowest response is at a location farthest from the output node of the first driving circuit 24. Moreover, the transistor 270 in the second set 27 that has the fastest response is at a location closest to an output node of the second driving circuit 25, and the transistor 270 in the second set 27 that has the slowest response is at a location farthest to the second driving circuit 25.

Figure 4:
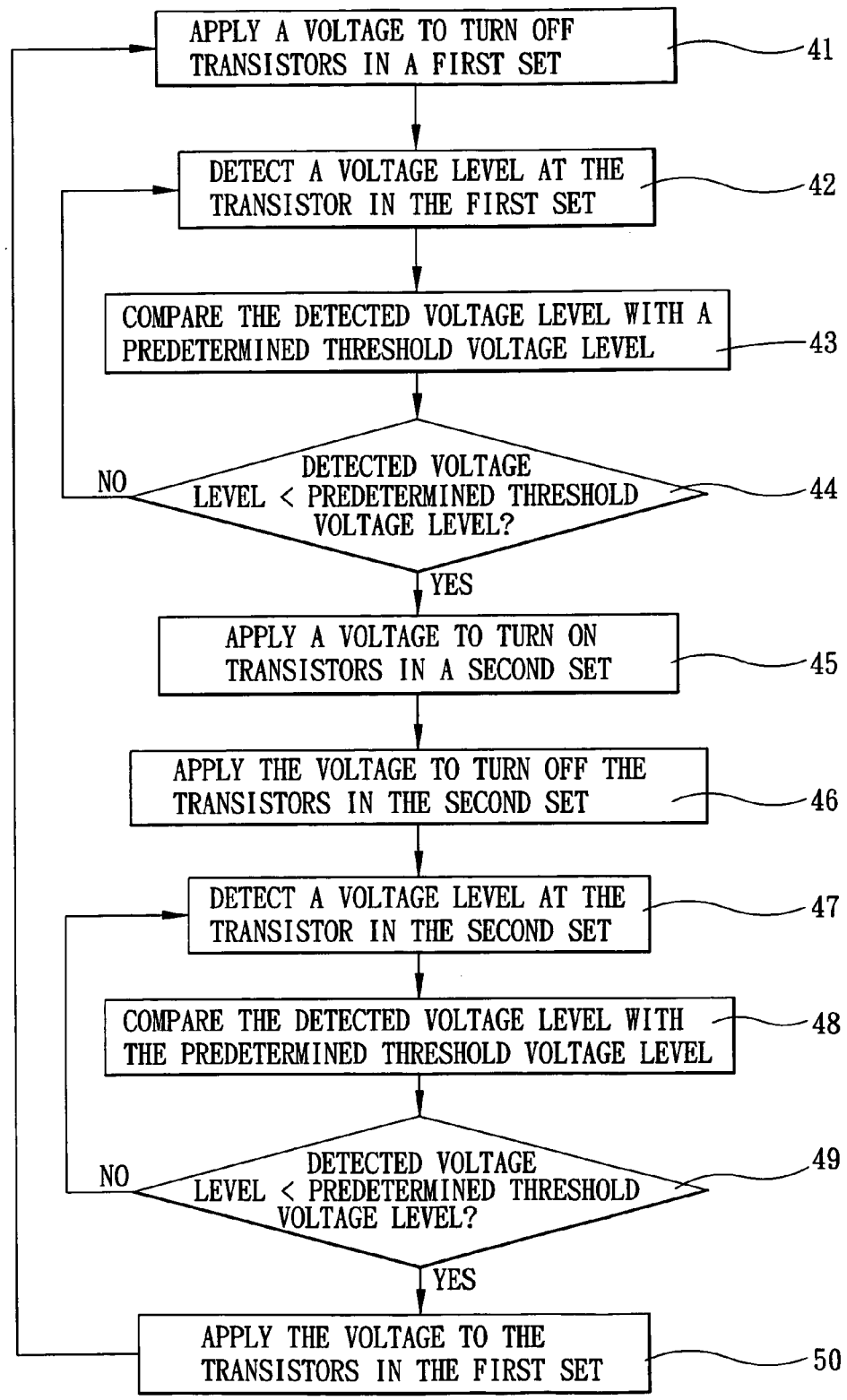
FIG. 4 is a flowchart of the preferred embodiment of a method for determining switching state of the transistor-based switching device shown in FIG. 3.

The preferred embodiment of a method for determining switching state of a transistor-based switching device according to this invention includes the steps shown in FIG. 4.

In step 41, the first driving circuit 24 applies a voltage to the gate (G) of the transistor 26 in the first set 260 that has the fastest response so as to dispose the transistors 260 in the first set 26 in a non-conducting state.

In step 42, the second logic circuit 23 detects a voltage level across the gate (G) and source (S) of the transistor 260 in the first set 26 that has the slowest response.

In step 43, the second logic circuit 23 compares the voltage level detected in step 42 with a predetermined threshold voltage level.

In step 44, when the voltage level detected in step 42 is found in step 43 to be lower than the predetermined threshold voltage level, the flow proceeds to step 45. Otherwise, the flow goes back to step 42.

In step 45, the second driving circuit 25 is enabled to apply a voltage to the gate (G) of the transistor 270 in the second set 27 that has the fastest response so as to dispose the transistors 270 in the second set 27 in a conducting state.

After a predetermined time period, in step 46, the second driving circuit 25 is enabled to apply the voltage to the gate (G) of the transistor 270 in the second set 27 that has the fastest response so as to dispose the transistors 270 in the second set 27 in the non-conducting state.

In step 47, the first logic circuit 22 detects a voltage level across the gate (G) and source (S) of the transistor 270 in the second set 27 that has the slowest response.

In step 48, the first logic circuit 22 compares the voltage level detected in step 47 with the predetermined threshold voltage level.

In step 49, when the voltage level detected in step 47 is found in step 48 to be lower than the predetermined threshold voltage level, the flow proceeds to step 50. Otherwise, the flow goes back to step 47.

In step 50, the first driving circuit 24 is enabled to apply the voltage to the gate (G) of the transistor 260 in the first set 26 that has the fastest response so as to dispose the transistors 260 in the first set 26 in the conducting transistor state. After the predetermined time period, the flow goes back to step 41.

From the above description, since the first (second) logic circuit 22 (23) detects the voltage level at the transistor 270 (260) in the second (first) set 27 (26) that has the slowest response to the bias voltage, the detected voltage level is an accurate indication of the transistor state of all the transistors 270 (260) in the second (first) set 27 (26).

Figure 5:
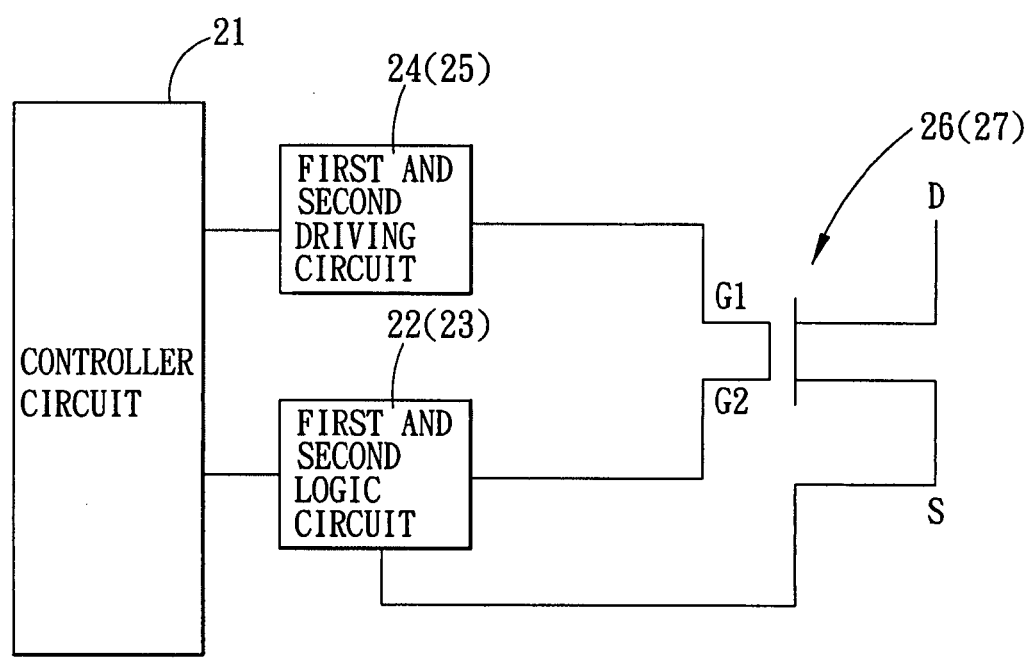
FIG. 5 is a schematic block diagram of an alternative embodiment of a transistor-based switching device according to the present invention.

In an alternative embodiment, as illustrated in FIG. 5, each of the transistors 260, 270 in the first and second sets 26, 27 may be one of an n-type and a p-type double gate MOSFET.

The first driving circuit 24 is connected electrically to a first gate (G1) of the transistor 260 in the first set 26 that has the fastest response, whereas the second driving circuit 24 is connected electrically to a first gate (G1) of the transistor 270 in the second set 27 that has the fastest response.

The first logic circuit 22 is connected electrically across second gate (G2) and a source of the transistor 270 in the second set 27 that has the slowest response, whereas the second logic circuit 23 is connected electrically across a second gate (G2) and a source of the transistor 260 in the first set 26 that has the slowest response.

Since the operation of the transistor-based switching device of this embodiment is similar to that described hereinabove, a detailed description of the same will be dispensed with herein for the sake brevity.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for determining a switching state of a transistor-based switching device, the switching device including a set of transistors that are connected in parallel in such a manner that one of the transistors has a fastest response to a bias voltage in relation to the other transistors in the set, and that another of the transistors has a slowest response to the bias voltage in relation to the other transistors in the set, each of the transistors in the set having a gate, the gate of the transistor having the fastest response to the bias voltage being provided with a drive end, the gate of the transistor having the slowest response to the bias voltage being provided with a detected end, said method comprising the steps of:

A) applying the bias voltage at the drive end of the transistor having the fastest response so as to dispose the transistors in the set in a desired transistor state;

B) detecting a voltage level at the detected end of the transistor having the slowest response; and C) comparing the voltage level detected in step B) with a predetermined threshold voltage level in order to determine the switching state of the switching device.

2. A method for determining a switching state of a transistor-based switching device, the switching device including first and second sets of transistors, the transistors in each of the first and second sets being connected in parallel in such a manner that one of the transistors in each of the first and second sets has a fastest response to a bias voltage in relation to the other transistors in the same one of the first and second sets, and that another of the transistors in each of the first and second sets has a slowest response to the bias voltage in relation to the other transistors in the same one of the first and second sets , each of the transistors in the each of the first and second sets having a gate, the gate of the transistor in each of the first and second sets having the fastest response to the bias voltage being provided with a drive end, the gate of the transistor in each of the first and second sets having the slowest response to the bias voltage being provided with a detected end, said method comprising the steps of:
- A) applying a first bias voltage to the drive end of the transistor in the first set that has the fastest response so as to dispose the transistors in the first set in a first transistor state;
- B) detecting a voltage level at the detected end of the transistor in the first set that has the slowest response; and
- C) comparing the voltage level detected in step B) with a predetermined threshold voltage level.

3. The method as claimed in claim 2, wherein each of the transistors in the first and second sets is an n-type transistor, said method further comprising the steps of D) when the voltage level detected in step B) is found in step C) to be lower than the predetermined threshold voltage level, applying a second bias voltage to the drive end of the transistor in the second set that has the fastest response so as to dispose the transistors in the second set in a second transistor state.

4. The method as claimed in claim 2, further comprising the steps of:
- E) applying the first bias voltage to the drive end of the transistor in the second set that has the fastest response so as to dispose the transistors in the second set in the first transistor state;
- F) detecting a voltage level at the detected end of the transistor in the second set that has the slowest response;
- G) comparing the voltage level detected in step F) with the predetermined threshold voltage level; and
- H) when the voltage level detected in step F) is found in step G) to be lower than the predetermined threshold voltage level, applying the second bias voltage to the drive end of the transistor in the first set that has the fastest response so as to dispose the transistors in the first set in the second transistor state.

5. The method as claimed in claim 2, wherein each of the transistors in the first and second sets is a p-type transistor, said method further comprising the steps of D) when the voltage level detected in step B) is found in step C) to be higher than the predetermined threshold voltage level, applying a second bias voltage to the drive end of the transistor in the second set that has the fastest response so as to dispose the transistors in the second set in a second transistor state.

6. The method as claimed in claim 2, further comprising the steps of:
- E) applying the first bias voltage to the drive end of the transistor in the second set that has the fastest response so as to dispose the transistors in the second set in the first transistor state;
- F) detecting a voltage level at the detected end of the transistor in the second set that has the slowest response;
- G) comparing the voltage level detected in step F) with the predetermined threshold voltage level; and
- H) when the voltage level detected in step F) is found in step G) to be higher than the predetermined threshold voltage level, applying the second bias voltage to the drive end of the transistor in the first set that has the fastest response so as to dispose the transistors in the first set in the second transistor state.

7. A transistor-based switching device, comprising: a set of transistors connected in parallel, each of which has a gate, said gate of one of said transistors that has a fastest response to a bias voltage in relation to the other transistors in the set being provided with a drive end, said gate of another one of said transistors that has a slowest response to the bias voltage in relation to the other transistors in the set being provided with a detected end,
- wherein, said drive end is adapted to be applied with a bias voltage so as to dispose the transistors in the set in a desired transistor state, and
- wherein, a voltage at said detected end is detected for comparison with a predetermined threshold voltage level in order to determine switching state of the switching device.

* * * * *